United States Patent
Scuderi et al.

(10) Patent No.: US 9,257,996 B2
(45) Date of Patent: Feb. 9, 2016

(54) OSCILLATOR CIRCUITS AND METHODS TO COMPENSATE FREQUENCY PULLING

(71) Applicant: STMICROELECTRONICS S.r.l., Agrate Brianza (MB) (IT)

(72) Inventors: Angelo Scuderi, Nicolosi (IT); Antonino Calcagno, Messina (IT); Salvatore Scaccianoce, Catania (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/741,731

(22) Filed: Jun. 17, 2015

(65) Prior Publication Data

US 2015/0381186 A1    Dec. 31, 2015

(30) Foreign Application Priority Data

Jun. 30, 2014   (IT) .............................. MI2014A1189

(51) Int. Cl.
| | |
|---|---|
| H03K 7/00 | (2006.01) |
| H03L 7/02 | (2006.01) |
| H04B 1/38 | (2015.01) |
| H04B 7/00 | (2006.01) |
| H03L 7/18 | (2006.01) |
| H04L 25/49 | (2006.01) |

(52) U.S. Cl.
CPC .. *H03L 7/02* (2013.01); *H03L 7/18* (2013.01); *H04B 1/38* (2013.01); *H04B 7/00* (2013.01); *H04L 25/4902* (2013.01)

(58) Field of Classification Search
CPC ......... H04B 7/00; H03L 7/18; H04L 25/4902
USPC ........... 455/258, 260; 332/107, 106; 331/175; 375/345, 254, 239; 370/210
See application file for complete search history.

(56) References Cited

U.S. PATENT DOCUMENTS

| | | |
|---|---|---|
| 2006/0202767 A1 | 9/2006 | Nayler |
| 2007/0026830 A1* | 2/2007 | Guilford ................. H03J 7/065 455/260 |
| 2012/0119942 A1 | 5/2012 | Moquillon et al. |

OTHER PUBLICATIONS

Razavi, B. "A study of injection locking and pulling in oscillators," IEEE Journal of Solid-State Circuits, vol. 39, 2004, pp. 1415-1424.

* cited by examiner

*Primary Examiner* — Arnold Kinkead
(74) *Attorney, Agent, or Firm* — Allen, Dyer, Doppelt, Milbrath & Gilchrist, P.A.

(57) ABSTRACT

An oscillator circuit may include a local oscillator to generate a carrier signal having a tunable frequency, a first modulator and a power amplifier coupled in cascade to the local oscillator to generate an output signal. The first modulator may be activated from a first modulating signal having a first frequency alternatively defining ON and OFF states of the first modulator. An estimator unit may receive the carrier signal during a time window and detect an estimated frequency variation of the carrier signal during the ON and OFF states. A compensation unit may include a second modulator to generate a compensation signal proportional to the estimated frequency variation and modulated with a second modulating frequency. The second modulating frequency may be substantially the same as the first modulating frequency, and the compensation signal may be added to a bias signal of the local oscillator to tune the tunable frequency.

17 Claims, 4 Drawing Sheets

OSCILLATOR CIRCUITS AND METHODS TO COMPENSATE FREQUENCY PULLING

TECHNICAL FIELD

This disclosure relates to electronic oscillator circuits with frequency pulling compensation. More particularly, the disclosure relates to electronic oscillator circuits, as direct conversion circuits having a local oscillator, a modulator with a pulse modulation signal, and a power amplifier integrated in the same semiconductor substrate, such as for automotive and industrial systems applications.

BACKGROUND

In silicon-chip implementations including a local oscillator and a power amplifier, the injection of a periodic signal may lead to a locking or pulling phenomena. The electronic circuits, such as RF transceivers or a device for frequency synthesis techniques, suffer from frequency pulling when a pulsed modulation signal is applied. During transmission of the pulses, for the RF transceiver having a transmitter and a receiver, having the power amplifiers and local oscillators in the same substrate affects the transmitted signal by generating an oscillation frequency change between the receiver local oscillator and the transmitted signal frequency.

The effect of the undesirable frequency deviation in the transmitted signal results in a loss of correlation that increases error in the demodulated signal from the receiver. A switching element in an electronic circuit having a local oscillator may generate similar effects by causing pulling effects.

In particular, the present disclosure relates to a silicon integrated circuit. Applicable fields may include integrated circuits on semiconductors, e.g., CMOS, Bipolar, BiCMOS technologies, radio frequency and microware applications, circuits including oscillators, power amplifiers and/or receivers, and integrated circuits for radar applications using pulse modulation techniques, for example.

A transceiver in accordance with the prior art is shown in FIG. 1, which includes a transmitter Tx and a receiver Rx. The transmitter Tx includes a local oscillator LO that generates a radio frequency carrier f1 which is modulated by a first switch S1 and amplified by a power amplifier PA. The transmitted signal is a train of pulses modulated using frequency, amplitude, pulse time duration, pulse position or other modulation techniques. The signal received from the receiver Rx is amplified by a low-noise amplifier LNA and down-converted to the intermediate frequency IF by an interposed adder, and by using a second switch S2.

The receiver Rx may also be switched to blind or turned off when the transmitter Tx generates the train of modulated pulses. The switches S1 and S2 are driven by a pilot signal PT and its complementary pilot signal PTn, respectively, as shown in FIG. 2.

Some prior art approaches provide a local oscillator LO by controlling the tuning voltage $V_{TUNE}$ through an open loop approach or PLL systems. These approaches, which are convenient in certain circumstances, also suffer from certain drawbacks. In particular, the compensation of the pulling frequency is reduced in high frequency oscillator circuits when the frequency is approximately of 24 GHz and/or 77-79 GHz, as in radar systems, i.e., having fast pulses. The local oscillator LO is subjected to the power coupling and/or impedance loading of the power amplifier PA that generates leakage current through the substrate or through circuit pathways of the chip.

This leakage current affects the oscillation frequency of the local oscillator LO wider than the ideal frequency during the open (ON) and closed (OFF) phases of the switch modulator S1. This pulling effect leads to a source of error for the transmitted signal which is found in a frequency deviation $\Delta\text{fer}=\text{f1}-\text{f2}$, from f1 frequency of carrier signal to f2 during the pulses transmission close phase of the switch modulator, as shown in FIG. 2. Moreover, it should be noted that even a control system such as a phase lock loop PLL cannot be used to compensate the frequency deviation for high-frequency applications wherein fast pulses are provided.

The document "A study of injection locking and pulling in oscillators" by Razavi B. IEEE Journal of Solid-State Circuits, vol. 39, 2004, pages 1415-1424, relates to an RF transceiver TX where the output signal of the power amplifier PA contains large spectral components in the vicinity of $\omega_{LO}$, leaking through the package and the substrate to the local oscillator LO and causing frequency deviation. The leakage of the power amplifier PA may be considered as a sinusoidal injection current that modifies the frequency where the local oscillation LO occurs.

It may be particularly desirable to improve the architecture of the local oscillator LO to reduce the pulling effect in an efficiency mode during high frequency modulation. It may be desirable to obtain a transceiver having frequency coherence between the transmitted/received signals and the carrier signal in a relatively simple implementation.

Moreover, a versatile approach that may be used in oscillator circuits integrated on semiconductors, e.g., CMOS, Bipolar, BiCMOS, radio frequency and microwave applications and integrated circuits for radar applications using pulse modulation techniques, may be desirable. Furthermore, it also may be desirable to provide an approach to increase the performance of current radar systems where high power pulses are transmitted that are used, for example, in automotive and industrial applications.

SUMMARY

According to an example embodiment, an oscillator circuit may include a local oscillator configured to generate a carrier signal having a tunable frequency, a first modulator and a power amplifier coupled in cascade to the local oscillator and configured to generate an output signal. The first modulator may be configured to be activated from a first modulating signal having a first modulating frequency defining alternate ON and OFF states of the first modulator. The oscillator circuit may further include an estimator unit configured to receive the carrier signal during a time window and to detect an estimated frequency variation of the carrier signal during the ON and OFF states of the first modulator. A compensation unit may include a second modulator configured to generate a compensation signal proportional to the estimated frequency variation and modulated with a second modulating frequency. The second modulating frequency may be substantially the same as the first modulating frequency, and the compensation signal may be added to a bias signal of the local oscillator to tune the tunable frequency.

According to one example aspect, the compensation unit may also include a logic unit coupled to a second modulator. The logic unit may be configured to receive the estimated frequency variation and to define a pre-compensation signal. The second modulator may be configured to modulate the pre-compensation signal by a second modulating signal having the second modulating frequency.

Moreover, the logic unit may be configured to generate an output digital signal, and the compensation unit may further include a digital to analog converter configured to receive the output digital signal, and to generate the pre-compensation signal. The compensation unit may comprise a finite state machine, for example.

Furthermore, the oscillator circuit may include an input terminal coupled to a voltage source by a first adder. The first adder may be configured to generate a voltage compensation signal by summing the bias voltage signal generated by the voltage source and the voltage compensation signal generated by the compensation unit.

Also, the local oscillator may include an input bias terminal coupled to a current source by a second adder. The second adder may be configured to generate a current compensation signal by summing the bias current signal generated by the current source and the current compensation signal generated by the compensation unit.

According to another example embodiment, a transceiver is provided which may include a transmitter and a receiver. The transmitter may be configured according to an oscillator circuit, and the receiver may include a low-noise amplifier coupled to a demodulator with an interposed adder. The interposed adder may be configured to receive the carrier signal of the local oscillator and may be coupled to the demodulator driven by a demodulating signal. The demodulating signal may have the same frequency of the first modulating signal and may be a complementary signal with respect to the first modulating signal.

According to another example embodiment, a method is provided to compensate the frequency pulling in an oscillator circuit. The method may include generating a carrier signal by a local oscillator operative to a tunable frequency, modulating the carrier signal with a first modulating signal having a first frequency by obtaining a modulated carrier signal, and amplifying the modulated carrier signal to generate an output signal. The method may further include processing the carrier signal in a time window and with a clock signal defining, during the time window, first time intervals and second time intervals. The method may further include estimating a first estimated frequency during the first time intervals and a second estimated frequency during the second time intervals, calculating an estimating frequency variation of the carrier signal as a difference between the first estimated frequency and the second estimated frequency, generating a pre-compensation signal setting from the estimated frequency variation value, and modulating the pre-compensation signal with a second modulating signal by obtaining a compensation signal. The second modulating signal may have the same frequency as the first modulating signal, and the compensation signal may be added to a bias signal of the local oscillator for tuning the tunable frequency.

According to another aspect, processing of the carrier signal may further include providing the first modulating signal as the clock signal, defining a logic state of the local oscillator by using a previous logic state of the local oscillator and by elaborating the estimated frequency variation value, generating an output digital signal by using the defined logic state of the local oscillator, and converting the output digital signal in an analog pre-compensation signal.

According to another example embodiment, a method is provided to compensate frequency pulling in a transceiver including a transmitter and a receiver. The receiver may receive an input signal and a carrier signal generated by a local oscillator of the transmitter for generating a received signal. The received signal may be demodulated by using a demodulator switch driven by a demodulating signal. The demodulating signal may have substantially the same frequency as the first modulating signal and may be a complementary signal with respect to the first modulating signal.

DETAILED DESCRIPTION

Figure 1:
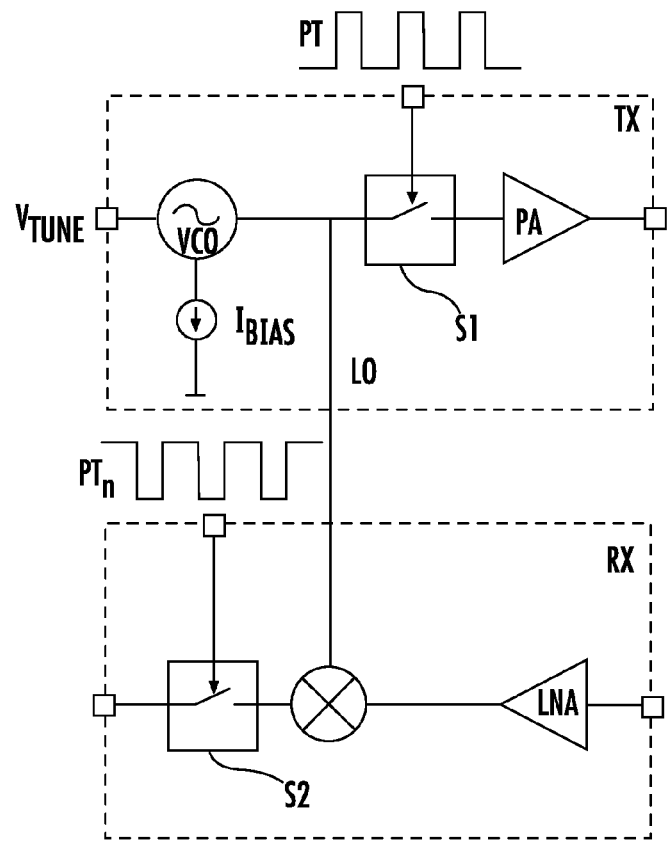
FIGS. 1 and 2 are respectively a schematic block diagram and wave form diagram of corresponding electric components according to an embodiment of the prior art.
Figure 2:
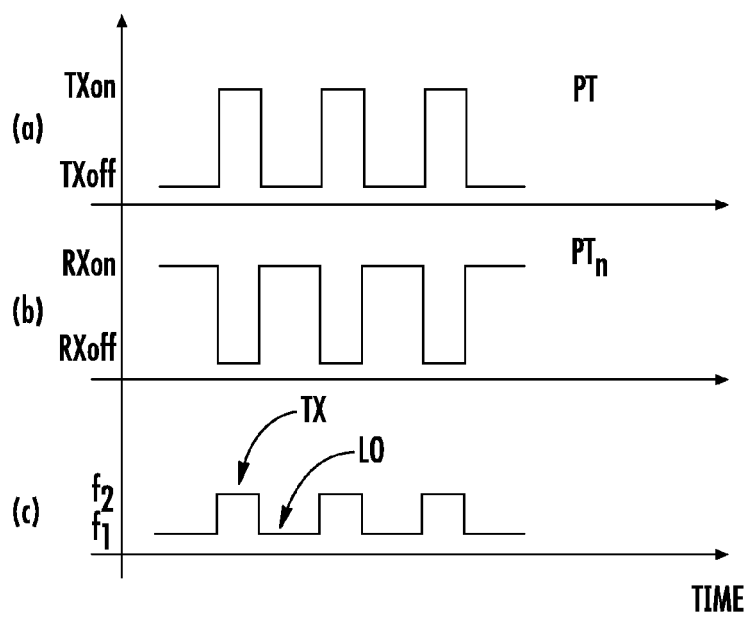
Figure 3:
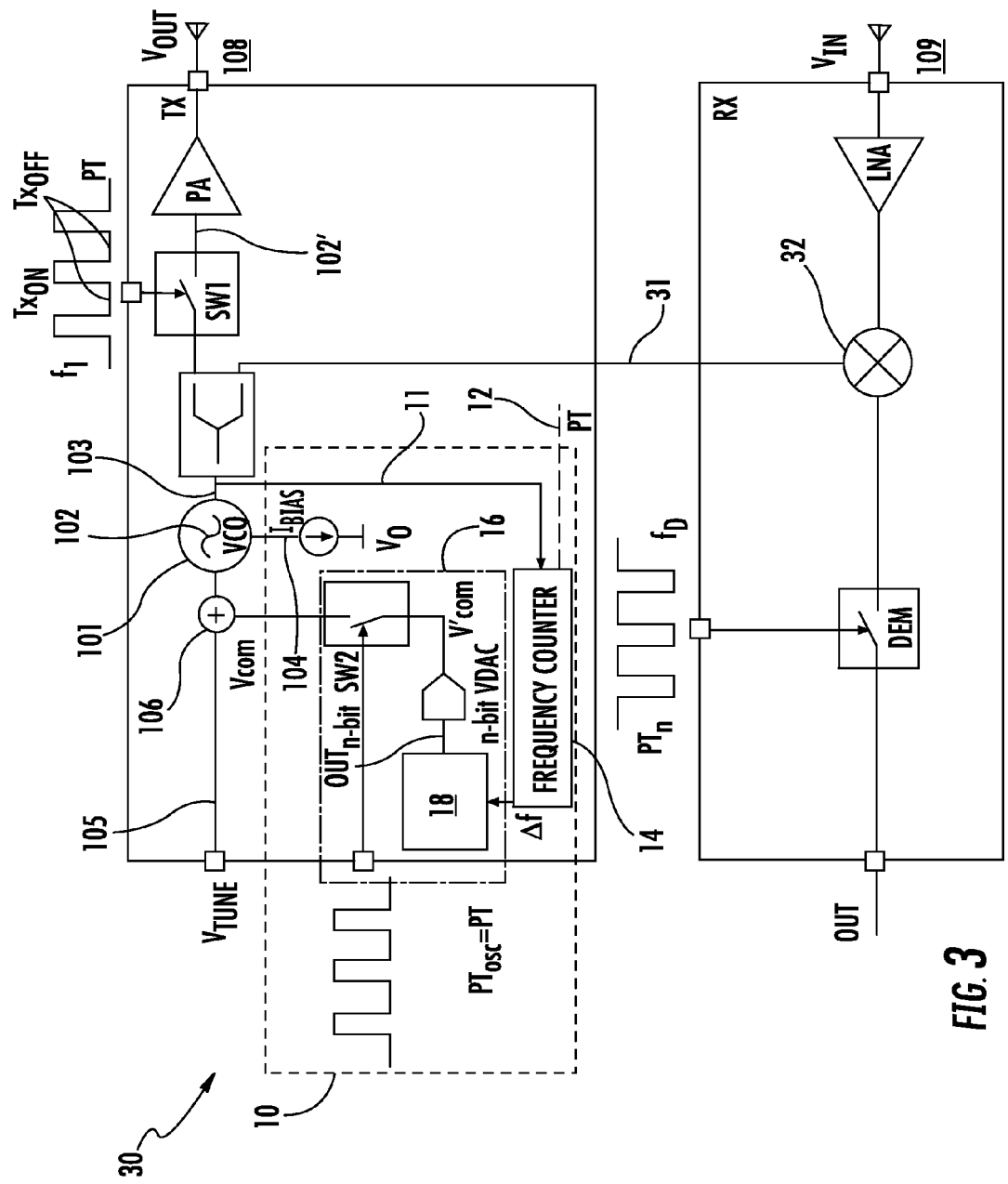
FIG. 3 is a schematic block diagram of a transceiver according to a first embodiment.

An oscillator circuit, according to one example embodiment, is generally referred to by numeral 30 in FIG. 3. The oscillator circuit 30 is a silicon integrated circuit and in a first embodiment is a transceiver which includes a transmitter Tx and a receiver Rx that are implemented in the same substrate. The following description refers to an example of the transceiver 30 configured with the necessary hardware and software to execute radar applications using pulse modulation techniques.

The transmitter Tx transmits an output signal $V_{OUT}$ that is a train of modulated pulses, and the receiver Rx receives an input signal $V_{IN}$ that is a return signal of the output signal $V_{OUT}$, like an echo. The correlation between the input signal $V_{IN}$ and the output signal $V_{OUT}$ defines correlation information which may be used for monitoring parameters of the environment around the transceiver 30. The transmitter Tx includes a local oscillator 101, which is configured to receive a bias voltage signal $V_{TUNE}$ and a bias current signal $I_{BIAS}$, and to generate a carrier signal 102 having a tunable frequency $f_r$. The transmitter Tx also includes a first modulator SW1 and a power amplifier PA configured to be coupled in cascade to the local oscillator 101 and to generate the output signal $V_{OUT}$.

The first modulator SW1 is configured to be coupled to an output terminal 103 of the local oscillator 101 to receive the carrier signal 102 to generate a modulated carrier signal 102'. In this embodiment, the carrier signal 102, and consequently the output signal $V_{OUT}$, are radio frequency signals.

The first modulator SW1 is configured to be activated from a first modulating signal PT having a first modulating frequency f1 that alternatively defines ON and OFF states of the first modulator SW1. The transmitter Tx further includes a control block 10 configured to receive the carrier signal 102 during a time window ΔTx. The time window ΔTx includes a predefined number of first time intervals $Tx_{ON}$ that correspond to the ON state of the first modulator SW1, and a predefined number of second time intervals $Tx_{OFF}$ that correspond to the OFF state of the first modulator SW1.

The control block 10 includes an estimator unit 14 that is configured to receive and process the carrier signal 102 during the time window ΔTx, and detect an estimated frequency variation Δf of the carrier signal 102 during the first time intervals $Tx_{ON}$ and the second time intervals $Tx_{OFF}$. According to an example embodiment, the transmitter Tx includes a compensation unit 16 that is configured to generate a voltage compensation signal Vcom proportional to the estimated frequency variation Δf. In particular, the compensation unit 16 is configured to generate a pre-compensation voltage signal V'com that is proportional to the estimated frequency variation Δf of the carrier signal 102, and which is modulated from a second modulator SW2 by a second modulating signal PTosc to obtain the voltage compensation voltage Vcom.

The second modulating signal PTosc has a second modulating frequency f2 that is substantially the same as the first modulating frequency f1 of the first modulating signal PT. In particular, the second modulating signal PTosc may be a signal having the same frequency of the first modulating signal PT, but with a different duty-cycle.

The transmitter Tx is further configured to add the voltage compensation signal Vcom to the bias voltage signal VTUNE of the local oscillator 101 to tune the tunable frequency $f_t$. The estimator unit 14 is configured with the necessary hardware and software to define a frequency counter. According to one embodiment, the estimator unit 14 includes an input terminal 11 configured to be selectively coupled to the output terminal 103 of the local oscillator 101 during the time window ΔTx. The input terminal 11 may also include a timing switch, which is not shown in the illustrated embodiment. The estimator unit 14 includes a further input terminal 12 (dotted line) that is configured to receive, as a clock signal, the first signal PT to determinate the first time intervals $TX_{ON}$ and the second time intervals $TX_{OFF}$ of the first modulator SW1.

The estimator unit 14 is configured to monitor during the time window ΔTx the carrier signal 102, and to estimate a first estimated frequency $F1_{ON}$ during the first time intervals $TX_{ON}$ that corresponds to the ON state of the first modulator SW1, and a second estimated frequency $F2_{OFF}$ during the second time intervals $Tx_{OFF}$ that corresponds to the OFF state of the first modulator SW1. The estimator unit 14 is configured to calculate the estimated frequency variation Δf as difference between the first estimated frequency $F1_{ON}$ and the second estimated frequency $F2_{OFF}$.

The compensation unit 16 comprises a logic unit 18 configured to define a model of the local oscillator 101. The logic unit 18 is configured to receive from the estimated unit 14 the estimated frequency variation Δf, and to define an output digital signal $OUT_{n-bit}$ adapted to generate the proportional pre-compensation voltage signal V'com.

According to one embodiment, the logic unit 18 is a finite state machine that receives the frequency variation Δf and sets a proper value of n-bit DAC which defines the output digital signal $OUT_{n-bit}$ according to a state N of the local oscillator 101. In particular, the finite state machine 18 is configured to determine the state N of the local oscillator 101 with respect to the estimated frequency variation Δf and a previous state N−1 of the local oscillator 101 that is stored in a memory.

The compensation unit 16 further includes a digital to analog voltage converter VDAC configured to receive the output digital signal $OUT_{n-bit}$, and to generate the pre-compensation voltage signal V'com that has a proportional voltage variation and corresponding to $[\pm 0.5*(2^n-1)*\Delta V]$, where the ΔV is a predefined voltage step value. The second modulator SW2 is configured to receive and to synchronize the voltage compensation signal Vcom by the first modulating signal PT.

The local oscillator 101 includes an input terminal 105 that receives a tuning voltage $V_{TUNE}$ from a tuning voltage source. A first adder 106, i.e. a voltage summing circuit, receives by the input terminal 105 the tuning voltage $V_{TUNE}$ and the voltage compensation signal Vcom that is set by the control block 10 according to the amount of the frequency pulling. In this way, the voltages to drive variable capacitors (junction or MOS semiconductors) are combined with to the bias voltage signal $V_{TUNE}$ or resonator to tune the tunable frequency $f_t$ and obtain a substantially stable oscillation frequency of the output signal $V_{OUT}$ during the ON and OFF states of the first modulator SW1.

It should be noted that the control block 10, during an initial calibration that corresponds to one or more time window ΔTx, performs an adjusting of the oscillator frequency of the local oscillator 101 to minimize the frequency deviation of the carrier signal 102 between first time intervals $TX_{ON}$ and second time intervals $TX_{OFF}$ of the first modulator SW1. After the initial calibration, the timing switch is disconnected to the output terminal 103 of the local oscillator 101, but the compensation signal Vcom is generated during the operation time of the local oscillator 101 for adjusting of the oscillator frequency of the local oscillator to compensate the pulling frequency phenomenon.

The receiver Rx includes a low-noise amplifier LNA coupled to a demodulator DEM with an interposed adder 32. The adder 32 is configured to receive from the local oscillator 101 the carrier signal 102 by an interposed terminal 31 that is coupled to the output terminal 103. The demodulator DEM is driven by a demodulating signal $PT_N$ that is a complementary signal with respect to the first modulating signal PT, and which has the same demodulating frequency $f_D$ of the first modulating signal PT.

The receiver Rx receives the input signal $V_{IN}$ that is amplified by the low-noise amplifier LNA and mixed with the carrier signal 102 and further demodulated by the demodulator DEM to generate an output data signal OUT. In this way, rectifying the tunable frequency $f_t$ of the local oscillator 101, the input signal $V_{IN}$, the output signal $V_{OUT}$ and the carrier signal 102 have the same frequency, and the frequency pulling phenomenon is reduced.

According to another embodiment now described with reference to FIG. 4, which is a dual mode with respect the above described embodiment, a transceiver 300 includes a transmitter Tx' and a receiver Rx. The transceiver Tx' corresponds substantially to the above described transceiver 30, thus in the following description only the differences will be described, and parts and details already described and having the same structure and function will be identified by the same signs and reference numbers.

In particular, the transmitter Tx' includes a control block 100 configured to modify the bias current signal $I_{TUNE}$ of the local oscillator 101 using a current compensation signal Icom. The transmitter Tx' includes the local oscillator 101 which is configured to receive a bias voltage signal $V_{TUNE}$ and a bias current signal $I_{BIAS}$, and to generate a carrier signal 102 having a tunable frequency $f_t$. The transmitter Tx' also includes the first modulator SW1 and the power amplifier PA configured to generate the output signal $V_{OUT}$. The first modulator SW1 is activated from the first modulating signal PT having the first modulating frequency f1 that alternatively defines ON and OFF states of the first modulator SW1.

The control block 10 includes an estimator unit 14 that is configured to receive the carrier signal 102 during the time window ΔTx to define an estimated frequency variation Δf of the carrier signal 102 during first time intervals $Tx_{ON}$ and during second time intervals $Tx_{OFF}$, In particular, the estimator unit 14 is configured to receive a signal clock which is the first modulating signal PT to define the first time intervals $Tx_{ON}$ and the second time intervals $Tx_{OFF}$.

The control block 100 further includes a compensation unit 160 having a logic unit 180 and a digital to analog current converter IDAC. The logic unit 180 is configured to define an output digital signal $OUT_{n-bit}$ that is set from the estimated frequency variation Δf. The digital to analog current converter IDAC is configured to receive the output digital signal OUT$_{n\text{-}bit}$ and to generate the proportional pre-compensation current signal I'com having a current variation of [±0.5*(2$^n$−1)*ΔI], where ΔI is a predefined current step value.

The second modulator SW2 is configured to receive and modulate the pre-compensation current signal I'com by the second modulating signal PTosc to obtain the current compensation signal Icom. In particular, the second modulating signal PTosc has a second modulating frequency f2 that substantially corresponds to the first modulating frequency f1 of the first modulating signal PT. In particular, the second modulating signal PTosc is a signal having the same frequency of the first modulating signal PT with a different duty cycle.

The transmitter Tx' further includes an input bias terminal 104 coupled to a current generator 20 by a second adder 107, i.e. a current summing circuit. The current generator 20 is coupled to a reference voltage Vo and configured to generate the bias current signal I$_{BIAS}$. The reference voltage Vo is the ground voltage. The adder 107 is configured to receive the current compensation signal Icom and the bias current signal I$_{TUNE}$, and to generate a bias current adapted to tune the tunable frequency f$_t$ of the local oscillator 101 proportional to the estimated frequency variation Δf.

The receiver Rx is configured to receive the carrier signal 102 from the local oscillator 101 by an interposed terminal 31 coupled to the output terminal 103. Furthermore, the receiver Rx is configured to receive the input signal V$_{IN}$ that is amplified by the low-noise amplifier LNA and mixed with the carrier signal 102 and further demodulated by the demodulator DEM to generate an output data signal OUT. The demodulator DEM is driven by a demodulating signal PT$_N$ that is a complementary signal with respect to the first modulating signal PT and having the same demodulating frequency f$_D$ of the first modulating signal PT. According to one embodiment, the transceiver 30 is implemented in a radar system where the estimated frequency variation Δf is lower than 1 MHz for the first modulating frequency (f1) of 24 Ghz.

A related method is also provided to compensate the frequency pulling in an oscillator circuit, Tx or Tx', which includes a local oscillator 101 that is operative to a tunable frequency f$_t$. In the following description, parts and details already described and having the same structure and function as above described will be identified by the same signs and reference numbers.

The oscillator circuit, Tx or Tx', includes a first modulator SW1 and a power amplifier PA coupled in cascade to the local oscillator 101 and configured to generate an output signal V$_{OUT}$. In particular, the power amplifiers PA and the local oscillator 101 are integrated in the same semiconductor substrate. The method includes generating a carrier signal 102 by the local oscillator 101, modulating the carrier signal 102 by the first modulator SW1 with a first modulating signal PT having a first modulating frequency f1 by obtaining a modulated carrier signal 102', and amplifying the modulated carrier signal 102' by the power amplifier PA to generate the output signal V$_{OUT}$. The method further includes transmitting the output signal V$_{OUT}$ by a transmitting antenna 108.

According to an example embodiment, the oscillator circuit is a transmitter Tx of a radar system, and the carrier signal 102, and consequently the output signal V$_{OUT}$, are radio frequency signals. The first modulating signal PT has a first modulating frequency f1 that alternatively defines ON and OFF states of the first modulator SW1. The method further includes processing the carrier signal 102 during a time window ΔTx by a control block, 10 or 100, and estimating an estimated frequency variation Δf of the carrier signal 102 by an estimator unit 14 during first time intervals Tx$_{ON}$ and during second time intervals Tx$_{OFF}$ of the first modulating signal PT in the time window ΔTx.

More particularly, the estimating may include providing the estimator unit 14 with a clock signal to define during the time window (ΔTx) first time intervals (Tx$_{ON}$) and second time intervals (Tx$_{OFF}$), estimating a first estimated frequency time F1$_{ON}$ during the first time intervals Tx$_{ON}$, estimating a second estimated frequency F2$_{OFF}$ during the second time intervals Tx$_{OFF}$, and calculating the estimated frequency variation Δf as a difference between the first estimated frequency F1$_{ON}$ and the second estimated frequency F2$_{OFF}$.

According to one example embodiment, the method may further include providing the first modulating signal (PT) as the clock signal. The method may also include generating a pre-compensation signal, V'com or I'com, setting from the estimated frequency variation Δf, modulating the pre-compensation signal, V'com or I'com, with a second modulating signal PTosc having substantially the same frequency f1 of the first modulating signal PT to obtain a compensation signal, Vcom or Icom, and mixing the compensation signal, Vcom or Icom, to a bias signal, VTUNE or I$_{TUNE}$, of the local oscillator 101 for tuning the tunable frequency f1 to shift the phase of the carrier signal 102 output from the local oscillator 101.

According to one embodiment, the second modulating signal PTosc is a signal having the same frequency of the first modulating signal PT with a different duty-cycle. In particular, generating a pre-compensation signal, V'com or I'com, may include defining a logic state N of the local oscillator 101 by using a previous logic state N−1 of the local oscillator 101 obtained by a logic unit, 18 or 180, and elaborating the estimated frequency variation value Δf. Further, an output digital signal OUT$_{n\text{-}bit}$ may be generated by using the defined logic state N of the local oscillator 101, and the output digital signal OUT$_{n\text{-}bit}$ may be converted in the analog pre-compensation signal, V'com or I'com, having a proportional variation to the output digital signal OUT$_{n\text{-}bit}$ by using a digital to analog converter, VDAC or IDAC. According to one embodiment, the logic unit, 18 or 180, may be a finite state machine (FSM).

In a dual mode, the analog pre-compensation signal, V'com or I'com, may be an analog pre-compensation voltage signal V'com or an analog pre-compensation current signal I'com to provide, respectively, a voltage compensation signal Vcom or a current compensation signal Ico. According to one example embodiment, as seen in FIG. 3, the output digital signal OUT$_{n\text{-}bit}$ is converted in the analog pre-compensation voltage signal V'com that has a proportional variation corresponding to [±0.5*(2$^n$−1)*ΔV], where ΔV is a predefined voltage step value. Thus, the method includes modulating the pre-compensation voltage signal V'com by the second modulating signal PTosc and mixing the voltage compensation signal Vcom to the voltage bias signal VTUNE of said local oscillator 101 by a first adder 106, i.e., a voltage summing unit, for tuning the tunable frequency f1 of the local oscillator 101.

The method may also include an initial calibration by adjusting the oscillator frequency of the local oscillator 101 to minimize the frequency deviation of the carrier signal 102 between first time intervals TX$_{ON}$ and second time intervals TX$_{OFF}$ of the first modulator SW1. Thus, adjusting of the oscillator frequency of the local oscillator 101 is maintained during the operation of the local oscillator 101 for reducing the pulling frequency phenomenon.

Figure 4:
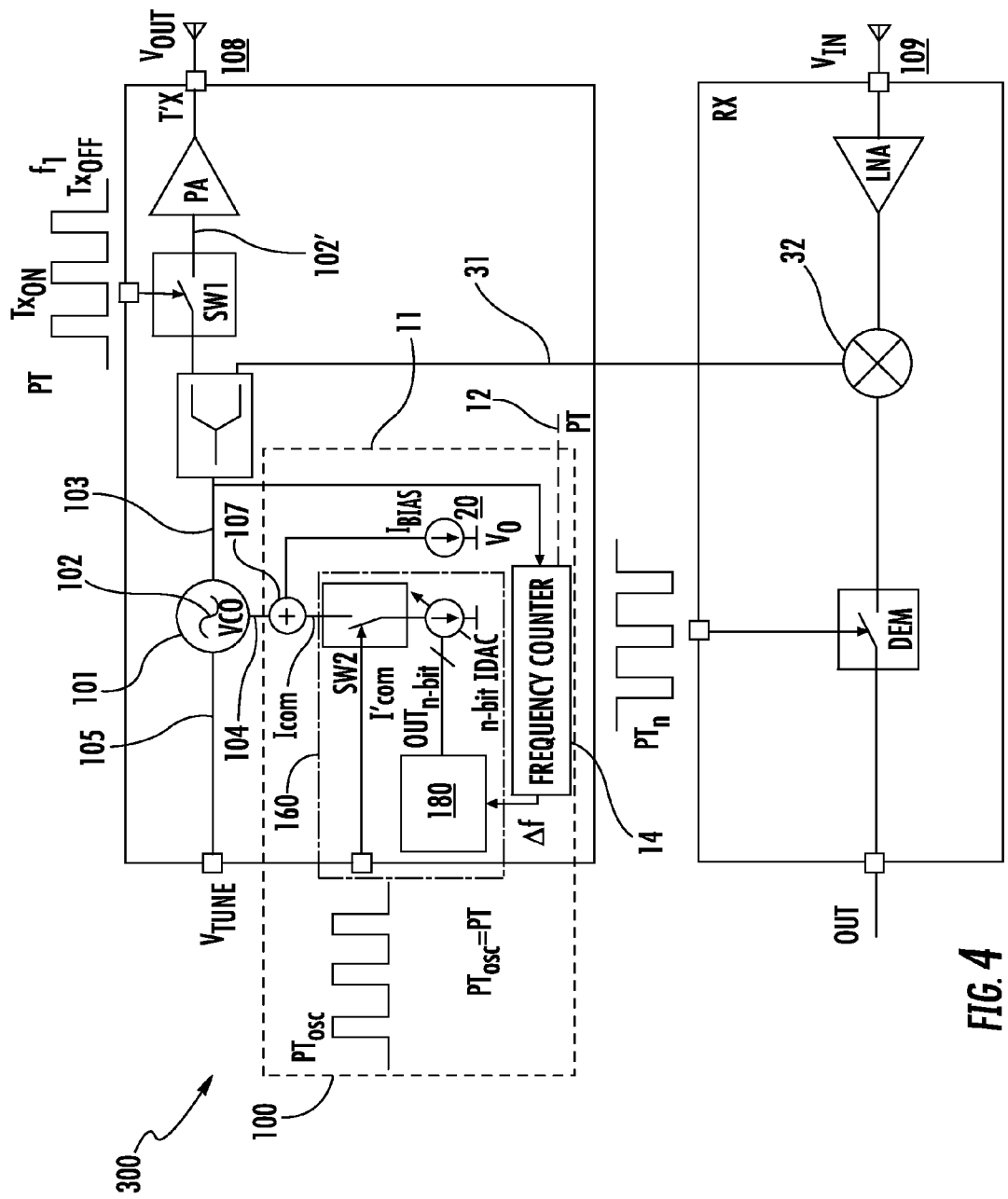
FIG. 4 is a schematic block diagram of a transceiver according to a second embodiment.

According to another embodiment, as seen in FIG. 4, in a dual mode with respect to the above-noted embodiment of FIG. 3, the output digital signal OUT$_{n\text{-}bit}$ is converted in the analog pre-compensation current signal I'com that has a proportional variation corresponding to [±0.5*(2$^n$−1)*ΔI], where the ΔI is a predefined current step value. The method may further include modulating the pre-compensation current signal I'com by the second modulating signal PTosc, and summing the compensation current signal Icom to the bias current signal $I_{TUNE}$ of the local oscillator 101 by a second adder 107, i.e., a current summing unit, for tuning the tunable frequency f1 of the local oscillator 101.

A method is also provided to compensate the frequency pulling in a transceiver, 30 or 300. The method may include providing a transmitter, Tx or Tx', as above described, generating a receiver Rx receiving the carrier signal 102 of the local oscillator 101 by an interposed terminal 31 coupled to an output terminal 103 of the local oscillator 101 and receiving an input signal $V_{IN}$ by an input antenna 109. The input signal $V_{IN}$ may be a return signal, like an echo, of the output signal $V_{OUT}$ transmitted from the transmitter Tx or Tx'. The method may further include adding the input signal $V_{IN}$ with the carrier signal 102 by using an adder 32 to obtain a receiving signal, and demodulating the receiving signal by using a demodulator switch DEM driven by a demodulator signal $PT_N$ to generate an output data signal OUT.

More particularly, the method may also include providing the demodulator signal $PT_N$ as a complementary signal with respect to the first modulating signal PT and having a demodulating frequency $f_D$ that substantially corresponds to the first frequency f1 of the first modulating signal PT. Rectifying the tunable frequency $f_t$ of the local oscillator 101 allows for a reduction of the frequency pulling phenomenon having the input signal $V_{IN}$, the output signal $V_{OUT}$ and the currier signal 102 with the same frequency.

Having thus described at least one illustrative embodiment of the invention, various alterations, modifications, and improvements will readily occur to those skilled in the art. Accordingly, the foregoing description is by way of example only and is not intended as limiting.

Figure 5:
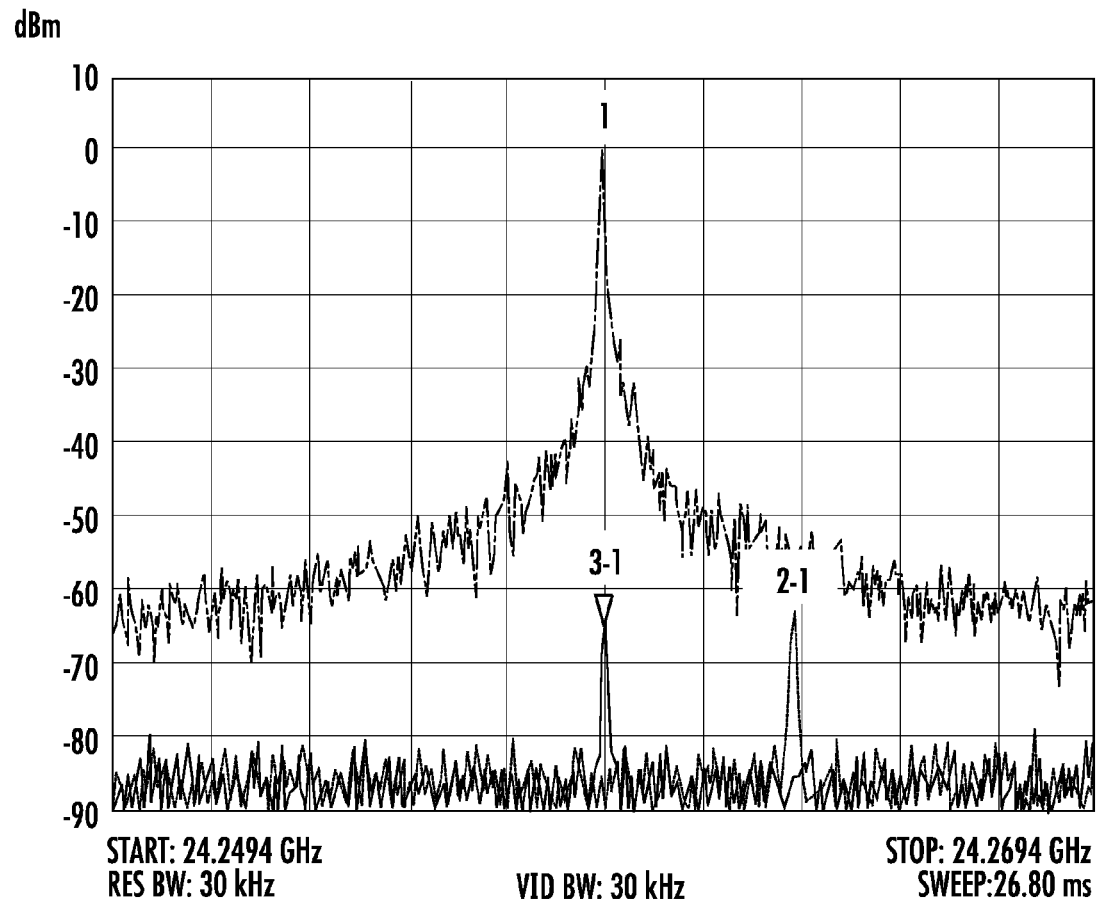
FIG. 5 is a graph of dBm vs. frequency and an associated table illustrating characteristics of experimental behaviors of the oscillator of FIG. 3 for estimated frequency variations of about 4 MHz and 33 kHz with and without the present approach applied respectively.

Experimental results for the above-described approach are shown in FIG. 5. Using an example frequency of 24.2594 GHz (marker 1), the results where acquired by using a spectrum analyzer which shows the frequency pulling in the case where a compensation circuit is used. In a system affected by a frequency pulling as high as 4 MHz (marker 2-1), the compensation circuit reduces the frequency pulling to within a range of 35 kHz (marker 3-1).

That which is claimed is:

1. An oscillator circuit comprising:
   a local oscillator configured to generate a carrier signal having a tunable frequency;
   a first modulator and a power amplifier coupled to the local oscillator and configured to generate an output signal, the first modulator configured to be activated from a first modulating signal alternatively defining ON and OFF states of the first modulator;
   an estimator unit configured to receive the carrier signal during a time window and to detect an estimated frequency variation of the carrier signal during the ON and OFF states of the first modulator; and
   a compensation unit coupled to the local oscillator and comprising a second modulator configured to generate a compensation signal for tuning the tunable frequency, the compensation signal being related to the estimated frequency variation based upon a second modulating signal different than the first modulating signal.

2. The oscillator circuit of claim 1 wherein the compensation unit further comprises a logic unit coupled to said second modulator; and wherein the logic unit is configured to receive the estimated frequency variation and to define a pre-compensation signal.

3. The oscillator circuit of claim 2 wherein the logic unit is configured to generate an output digital signal; and wherein the compensation unit further comprises a digital-to-analog converter configured to receive the output digital signal from the logic unit and to generate the pre-compensation signal.

4. The oscillator circuit of claim 1 wherein the local oscillator comprises an input terminal; and further comprising a first adder coupling the input terminal of the local oscillator to a voltage source, the first adder being configured to generate a voltage compensation signal by summing a bias voltage signal generated by the voltage source and the compensation signal generated by the compensation unit.

5. The oscillator circuit of claim 4 wherein the local oscillator comprises an input bias terminal; and further comprising a second adder coupling the input bias terminal to a current source, the second adder being configured to generate a current compensation signal by summing a bias current signal generated by the current source and the compensation signal generated by the compensation unit.

6. The oscillator circuit of claim 1 wherein the compensation unit comprises a finite state machine.

7. The oscillator circuit of claim 1 wherein the first and second modulating signals have a same frequency and a different duty cycle.

8. A transceiver comprising:
   a transmitter comprising
      a local oscillator configured to generate a carrier signal having a tunable frequency,
      a first modulator and a power amplifier coupled to the local oscillator and configured to generate an output signal, the first modulator configured to be activated from a first modulating signal alternatively defining ON and OFF states of the first modulator,
      an estimator unit configured to receive the carrier signal during a time window and to detect an estimated frequency variation of the carrier signal during the ON and OFF states of the first modulator, and
      a compensation unit coupled to the local oscillator and comprising a second modulator configured to generate a compensation signal for tuning the tunable frequency, the compensation signal being related to the estimated frequency variation based upon a second modulating signal different than the first modulating signal; and
   a receiver comprising
      a low-noise amplifier (LNA) having an input for a received signal and an output,
      an adder having a first input coupled to output of the LNA, a second input coupled to the carrier signal, and an output, and
      a demodulator coupled to the output of the adder for demodulating the signal output by the adder at a same frequency associated with the first modulation signal.

9. The transceiver of claim 8 wherein said transmitter transmits radar signals; wherein the first and second modulating signals have a modulating frequency of 24 GHz; and wherein the estimated frequency variation is less than 1 MHz.

10. The transceiver of claim 8 wherein the compensation unit further comprises a logic unit coupled to the second modulator; and wherein the logic unit is configured to receive the estimated frequency variation and to define a pre-compensation signal.

11. The transceiver of claim 10 wherein the logic unit is configured to generate an output digital signal; and wherein the compensation unit further comprises a digital-to-analog converter configured to receive the output digital signal from the logic unit and to generate the pre-compensation signal.

12. The transceiver of claim 8 wherein the compensation unit comprises a finite state machine.

13. The transceiver of claim 8 wherein the first and second modulating signals have a same frequency and a different duty cycle.

14. A method to compensate frequency pulling in an oscillator circuit comprising:
   generating a carrier signal using a local oscillator operating at a tunable frequency;
   modulating the carrier signal based upon a first modulating signal by obtaining a modulated carrier signal and amplifying the modulated carrier signal to generate an output signal;
   processing the carrier signal in a time window and based upon a clock signal to define, during the time window, first time intervals and second time intervals;
   estimating a first estimated frequency during the first time intervals and a second estimated frequency during the second time intervals;
   determining an estimating frequency variation of the carrier signal as a difference between the first estimated frequency and the second estimated frequency;
   generating a pre-compensation signal from the estimated frequency variation value;
   modulating the pre-compensation signal with a second modulating signal different than the first modulating signal to obtain a compensation signal; and
   tuning the local oscillator based upon the compensation signal.

15. The method of claim 14 wherein processing the carrier signal comprises:
   providing the first modulating signal as the clock signal;
   defining a logic state N of the local oscillator by using a previous logic state N−1 of the local oscillator; and
   generating an output digital signal using the defined logic state (N) of the local oscillator;
   converting the output digital signal into an analog pre-compensation signal.

16. The method of claim 14 wherein the first and second modulating signals have a same frequency and a different duty cycle.

17. The method of claim 14 wherein the oscillator is implemented in a transceiver comprising a transmitter and receiver; and further comprising:
   transmitting an output signal from the transmitter and receiving an input signal at the receiver;
   amplifying the input signal and combining the input signal with the carrier signal to produce a receiving signal; and
   demodulating the receiving signal using a demodulator switch at a same frequency associated with the first modulation signal.

* * * * *